US011424250B2

(12) United States Patent
Oruganti et al.

(10) Patent No.: US 11,424,250 B2
(45) Date of Patent: Aug. 23, 2022

(54) MEMORY

(71) Applicant: QUALCOMM Incorporated, San Diego, CA (US)

(72) Inventors: Kalyan Kumar Oruganti, Vijayawada (IN); Sreeram Gurram, Nellore (IN); Venkata Balakrishna Reddy Thumu, Bangalore (IN); Pradeep Jayadev Kodlipet, Bangalore (IN); Diwakar Singh, Delhi (IN); Channappa Desai, Haveri (IN); Sunil Sharma, Bangalore (IN); Anne Srikanth, Bangalore (IN); Yandong Gao, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 86 days.

(21) Appl. No.: 17/004,457

(22) Filed: Aug. 27, 2020

(65) Prior Publication Data

US 2022/0068940 A1    Mar. 3, 2022

(51) Int. Cl.
    *H01L 27/11* (2006.01)
    *H01L 27/088* (2006.01)
    *H01L 29/423* (2006.01)

(52) U.S. Cl.
    CPC ...... *H01L 27/1104* (2013.01); *H01L 27/0886* (2013.01); *H01L 29/42356* (2013.01)

(58) Field of Classification Search
    CPC ........... H01L 29/42356; H01L 27/0207; H01L 27/1116; H01L 27/0886; H01L 27/1104

USPC ....................................................... 257/288

See application file for complete search history.

(56) References Cited

U.S. PATENT DOCUMENTS

| | | | |
|---|---|---|---|
| 9,792,958 B1 * | 10/2017 | Laurent | G11C 11/2253 |
| 2003/0235070 A1 * | 12/2003 | Ooishi | G11C 11/1675 365/158 |
| 2007/0200182 A1 | 8/2007 | Liaw | |
| 2013/0141962 A1 | 6/2013 | Liaw | |
| 2013/0320458 A1 | 12/2013 | Deng et al. | |
| 2018/0113820 A1 * | 4/2018 | Kim | G06F 13/4282 |
| 2018/0151553 A1 | 5/2018 | Liaw | |

OTHER PUBLICATIONS

International Search Report and Written Opinion—PCT/US2021/041111—ISA/EPO—dated Sep. 30, 2021.

* cited by examiner

*Primary Examiner* — Dao H Nguyen
(74) *Attorney, Agent, or Firm* — Procopio, Cory, Hargreaves & Savitch LLP

(57) ABSTRACT

An IC includes a first memory block, a second memory block, and a first memory border cell between the first memory block and the second memory block. The first memory border cell includes a first memory core endcap to the first memory block on a first side of the cell. The first memory border cell further includes a second memory core endcap to the second memory block on a second side of the cell. The second side is opposite the first side. The first memory border cell further includes a memory gap portion between the first memory core endcap and the second memory core endcap. The memory gap portion provides a gap between the first memory core endcap and the second memory core endcap.

21 Claims, 10 Drawing Sheets

MEMORY

BACKGROUND

Field

The present disclosure relates generally to a standard/logic cell architecture, and more particularly, to a hard macro architecture.

Background

A standard cell device is an integrated circuit (IC) that implements digital logic. Such standard cell device may be reused multiple times within an application-specific IC (ASIC). An ASIC, such as a system-on-a-chip (SoC) device, may contain thousands to millions of standard cell devices. A typical IC includes a stack of sequentially formed layers. Each layer may be stacked or overlaid on a prior layer and patterned to form the shapes that define transistors (e.g., field effect transistors (FETs) and/or fin FETs (FinFETs)) and connect the transistors into circuits.

A static random access memory (SRAM) footprint in an SoC device may be around 60% of the die area. There is a need for a SRAM architecture that can provide for an SRAM area savings in order to reduce the SRAM footprint in an SoC device.

SUMMARY

In an aspect of the disclosure, a memory horizontal-border cell on an IC includes a first memory core endcap extending horizontally in a first direction on a first side of the cell. The memory horizontal-border cell further includes a second memory core endcap extending horizontally in the first direction on a second side of the cell. The second side is opposite the first side in a second direction. The second direction is orthogonal to the first direction. The memory horizontal-border cell further includes a memory gap portion extending horizontally in the first direction between the first memory core endcap and the second memory core endcap. The memory gap portion provides a gap in the second direction between the first memory core endcap and the second memory core endcap.

In an aspect of the disclosure, a memory vertical-border cell on an IC includes a first memory core endcap extending vertically in a second direction on a first side of the cell. The memory vertical-border cell further includes a second memory core endcap extending vertically in the second direction on a second side of the cell. The second side is opposite the first side in a first direction. The first direction is orthogonal to the second direction. The memory vertical-border cell further includes a memory gap portion extending vertically in the second direction between the first memory core endcap and the second memory core endcap. The memory gap portion provides a gap in the first direction between the first memory core endcap and the second memory core endcap.

In an aspect of the disclosure, an IC includes a first memory block, a second memory block, and a first memory border cell between the first memory block and the second memory block. The first memory border cell includes a first memory core endcap to the first memory block on a first side of the cell. The first memory border cell further includes a second memory core endcap to the second memory block on a second side of the cell. The second side is opposite the first side. The first memory border cell further includes a memory gap portion between the first memory core endcap and the second memory core endcap. The memory gap portion provides a gap between the first memory core endcap and the second memory core endcap.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

Figure 1:
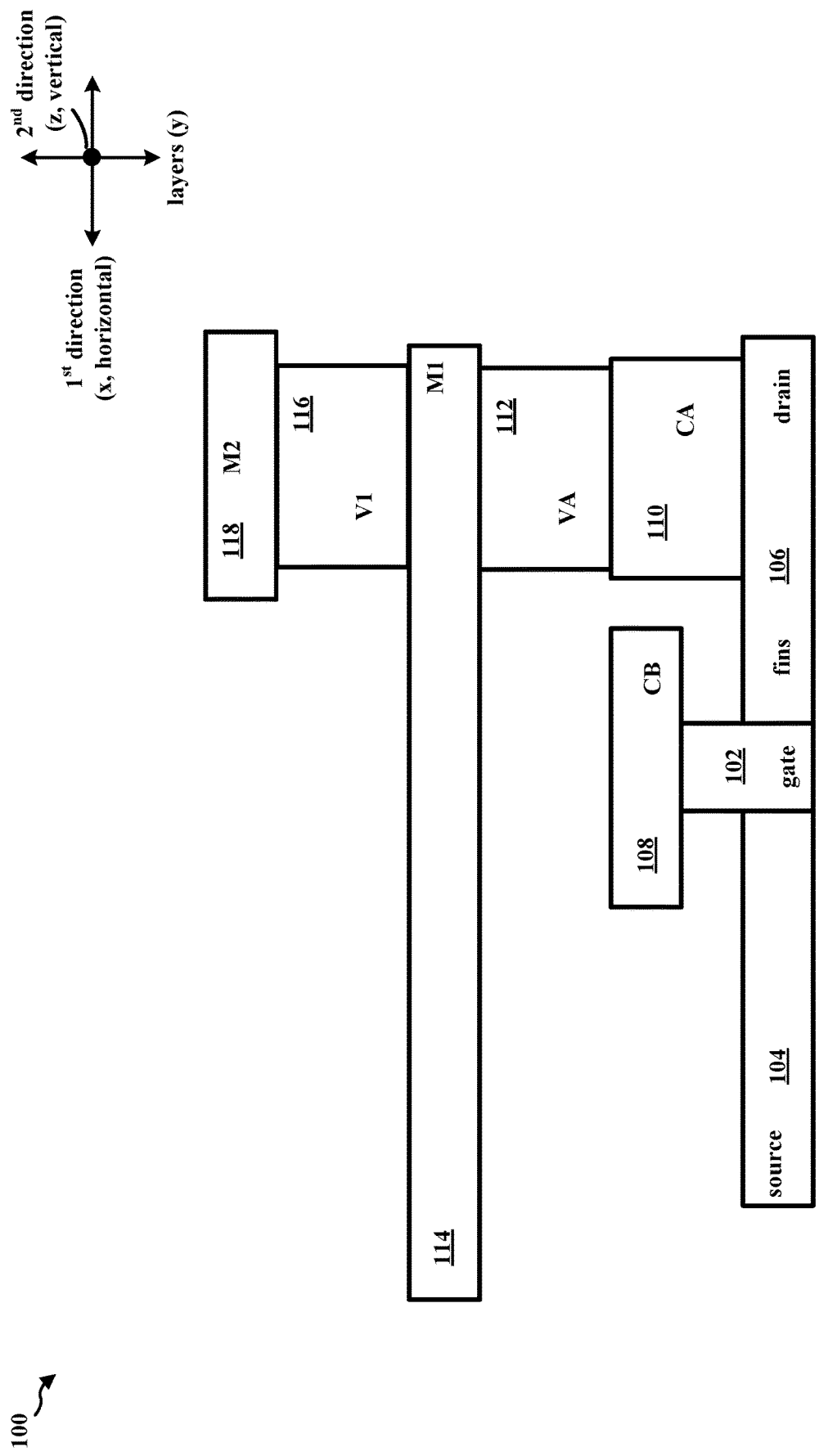
FIG. 1 is a first diagram illustrating a side view of various layers within a standard cell and IC.

FIG. 1 is a first diagram 100 illustrating a side view of various layers within a standard cell and IC. The various layers change in the y direction. As illustrated in FIG. 1, a transistor has a gate 102 (which may be referred to as POLY even though the gate may be formed of metal, polysilicon, or a combination of polysilicon and metal), a source 104, and a drain 106. The source 104 and the drain 106 may be formed by fins. The gate 102 may extend in a second direction (e.g., vertical direction along the z axis coming out of the page), and the fins may extend in a first direction orthogonal to the second direction (e.g., horizontal direction along the x axis). A contact B (CB) layer interconnect 108 (also referred to as a metal POLY (MP) layer interconnect) may contact the gate 102. A contact A (CA) layer interconnect 110 (also referred to as a metal diffusion (MD) layer interconnect) may contact the source 104 and/or the drain 106. A via 112 (which may be referred to as via A (VA)) may contact the CA layer interconnect 110. A metal 1 (M1) layer interconnect 114 may contact the via VA 112. The M1 layer interconnect 114 may extend in the first direction only (i.e., unidirectional in the first direction). A via V1 116 may contact the M1 layer interconnect 114. A metal 2 (M2) layer interconnect 118 may contact the via V1 116. The M2 layer interconnect 118 may extend in the second direction only (i.e., unidirectional in the second direction). The M2 layer is a lowest vertical layer. Specifically, the M2 layer may be unidirectional in the vertical direction, and is the closest vertically unidirectional layer to the silicon substrate. Higher layers include a via layer including vias V2 and a metal 3 (M3) layer including M3 layer interconnects. The M3 layer interconnects may extend in the first direction.

Figure 2:
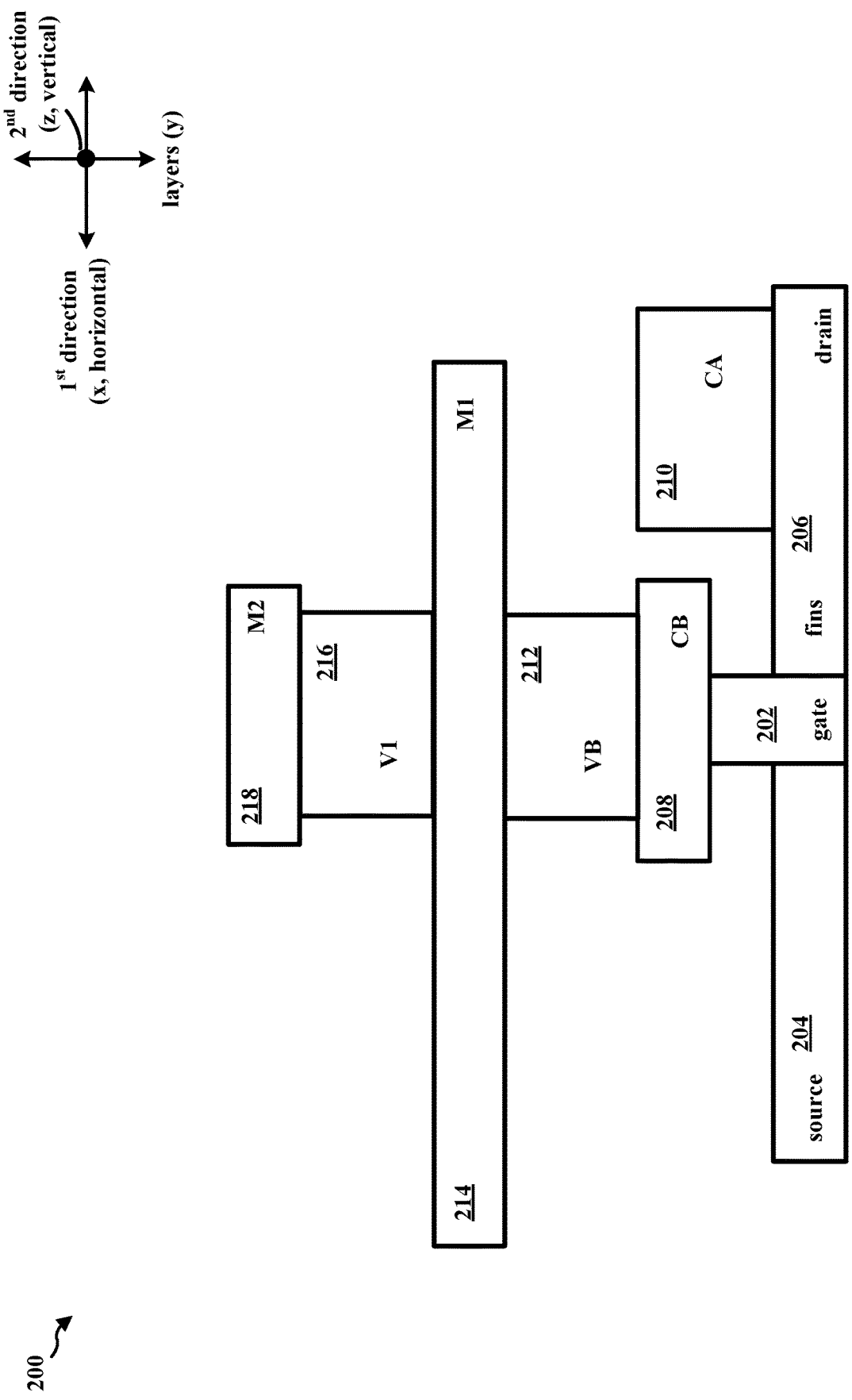
FIG. 2 is a second diagram illustrating a side view of various layers within a standard cell and IC.

FIG. 2 is a second diagram 200 illustrating a side view of various layers within a standard cell and IC. The various layers change in the y direction. As illustrated in FIG. 2, a transistor has a gate 202, a source 204, and a drain 206. The source 204 and the drain 206 may be formed by fins. The gate 202 may extend in a second direction (e.g., vertical direction along the z axis coming out of the page), and the fins may extend in a first direction orthogonal to the second direction (e.g., horizontal direction along the x axis). A CB layer interconnect 208 may contact the gate 202. A CA layer interconnect 210 may contact the source 204 and/or the drain 206. A via 212 (which may be referred to as via B (VB)) may contact the CB layer interconnect 208. An M1 layer interconnect 214 may contact the via VB 212. The M1 layer interconnect 214 may extend in the first direction only (i.e., unidirectional in the first direction). A via V1 216 may contact the M1 layer interconnect 214. An M2 layer interconnect 218 may contact the via V1 216. The M2 layer interconnect 218 may extend in the second direction only (i.e., unidirectional in the second direction). The M2 layer is a lowest vertical layer. Specifically, the M2 layer may be unidirectional in the vertical direction, and is the closest vertically unidirectional layer to the silicon substrate. Higher layers include a via layer including vias V2 and an M3 layer including M3 layer interconnects. The M3 layer interconnects may extend in the first direction.

As discussed supra, the SRAM footprint in an SoC device may be around 60% of the die area. In an SoC device, the SRAM blocks may be repeatedly placed in an array to achieve larger memory capacity for caches. A large array of SRAM blocks may result in a large area overhead due to requisite supporting structures of the core edge and boundary abutment requirements within the memory and at a top level interface. An SRAM architecture is provided infra in which SRAM blocks (which may be referred to as "base" SRAM blocks) exclude all or a subset of the memory core endcaps and boundary portions. In the provided SRAM architecture, separate memory horizontal-border cells and separate memory vertical-border cells are provided. On an IC, the memory horizontal-border cells may be located along and abutted to horizontal edges of base SRAM blocks, providing a memory core endcap and a boundary portion to the horizontal edges of the base SRAM block. In addition, on an IC, the memory vertical-border cells may be located along and abutted to vertical edges of the base SRAM blocks, providing a memory core endcap and a boundary portion to vertical edges of the base SRAM block. The separate base SRAM blocks, abutted with memory horizontal-border cells and memory vertical-border cells may provide an area savings of around 2%, if not more, and therefore may reduce the SRAM footprint in an SoC device.

Figure 3:
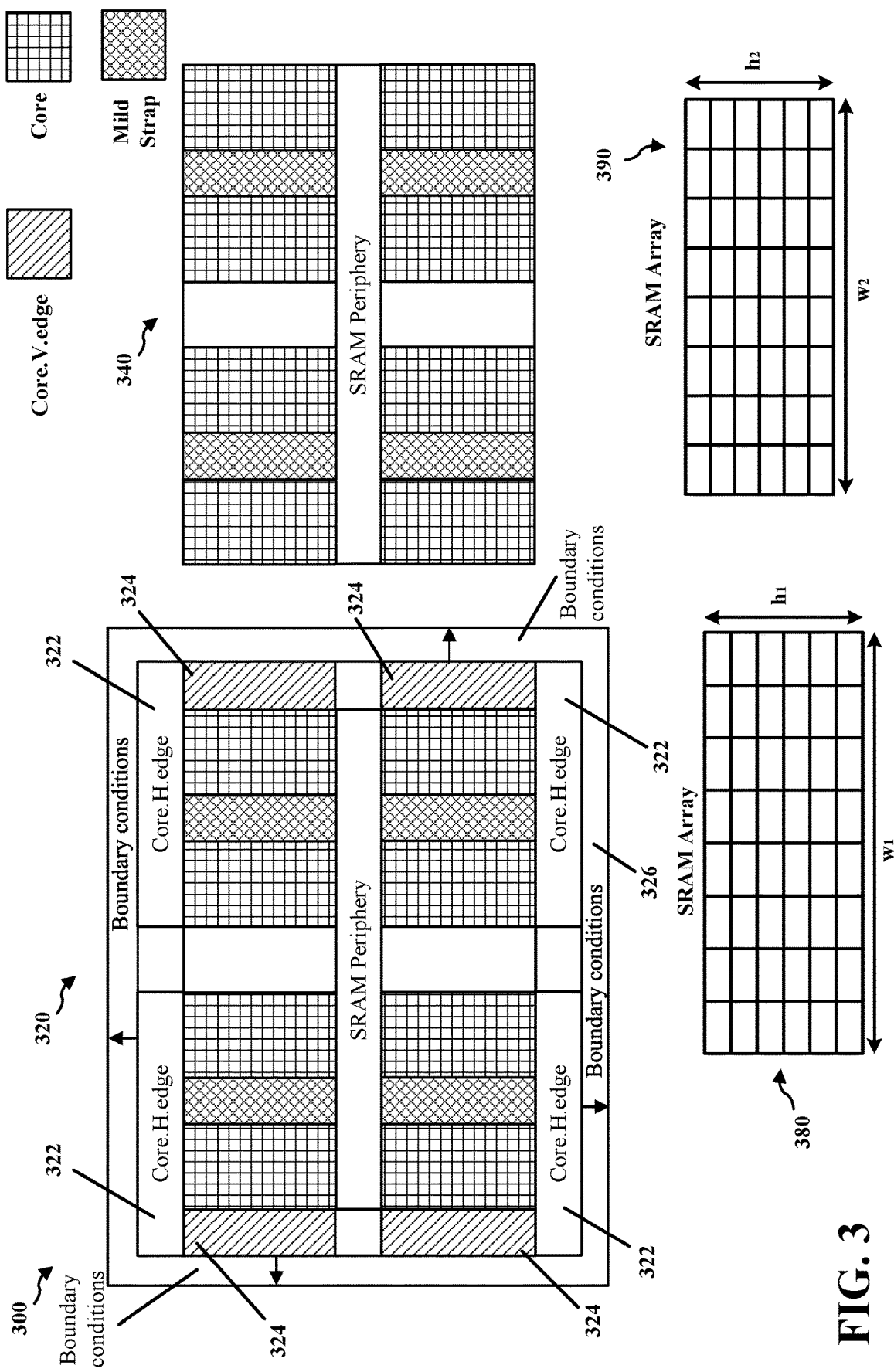
FIG. 3 is a first diagram conceptually illustrating an SRAM architecture.

FIG. 3 is a first diagram 300 conceptually illustrating an SRAM architecture. The SRAM block 320 includes core horizontal edge portions 322 and core vertical edge portions 324, as well as a boundary portion 326 that surrounds the core edge portions 322, 324 and satisfies foundry (semiconductor fabrication plant) boundary conditions. The core edge portions 322, 324 include well taps to prevent latch-up and any process uncertainties. The foundry boundary conditions are memory to memory abutment spacing design rule checking (DRC) rules for avoiding DRC violations. The base SRAM block 340 excludes core edge portions 322, 324 (also referred to as core edge strap regions) and the boundary portion 326. The core edge portions 322, 324 include the core horizontal edge portion 322 and the core vertical edge portion 324, both of which are excluded in the base SRAM block 340. In the provided SRAM architecture, base SRAM blocks 340 may be located on an IC, and separate memory horizontal-border cells and separate memory vertical-border cells may be located adjacent to and abutting the SRAM block 340. At least a subset of the separate memory horizontal-border cells and separate memory vertical-border cells are configured to terminate not one, but at least two adjacent base SRAM blocks 340 for satisfying the memory to memory spacing rules. The separate memory horizontal-border cells and separate memory vertical-border cells that are configured to terminate at least two adjacent base SRAM blocks 340 in an SRAM array 390 (area=$w_2 \ast h_2$) may be more compact than the separate core edge portions 322, 324 and boundary portions 326 of adjacent SRAM blocks 320 in the SRAM array 380 (area=$w_1 \ast h_1$). As such, an area savings of ($w_1 \ast h_1 - w_2 \ast h_2$)/$w_1 \ast h_1$ may be obtained through use of base SRAM blocks 340 in an SRAM array 390 with the provided (see FIGS. 6-8) separate double/dual terminated memory horizontal-border cells and memory vertical-border cells.

Figure 4:
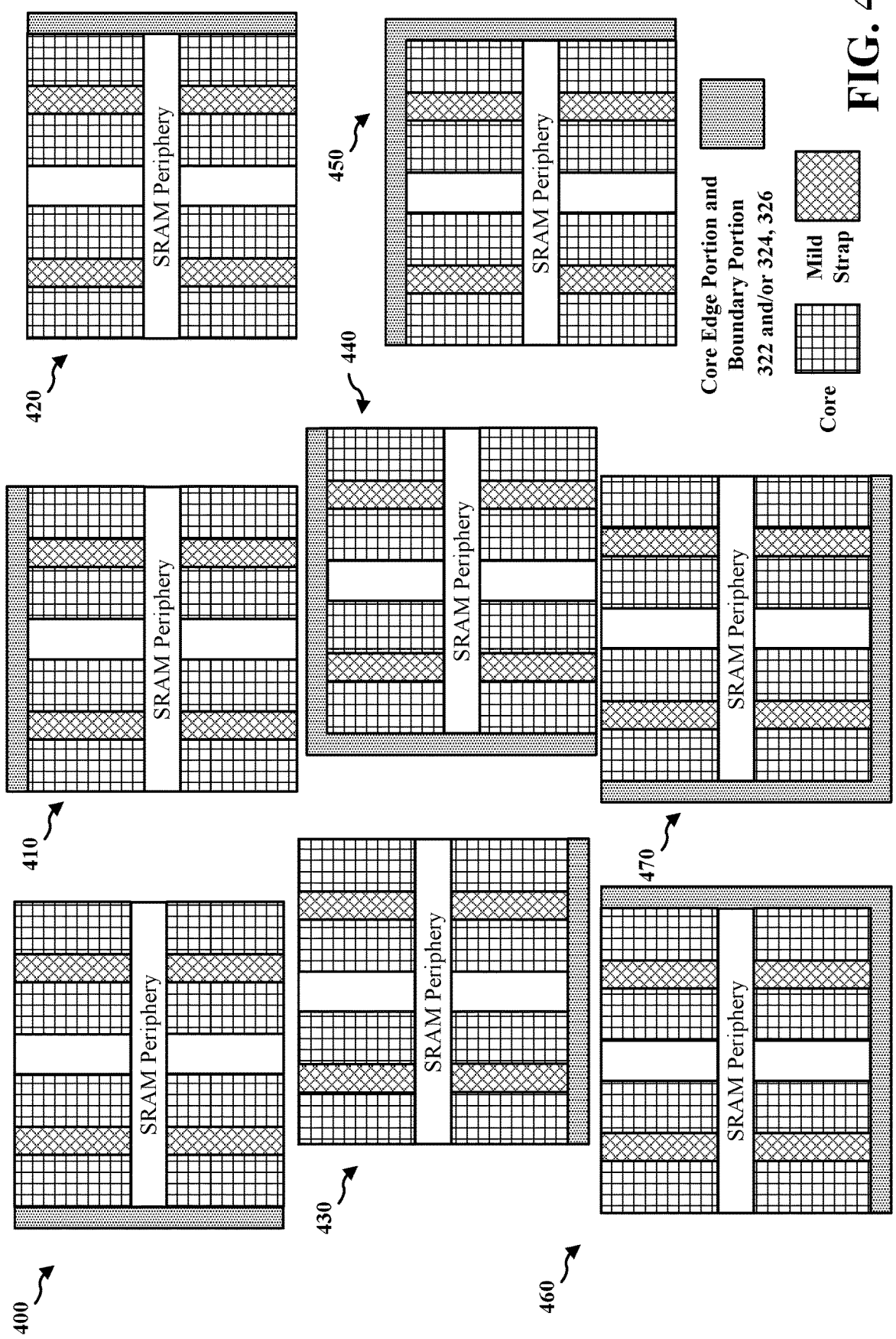
FIG. 4 are diagrams conceptually illustrating additional SRAM architectures.
Figure 5:
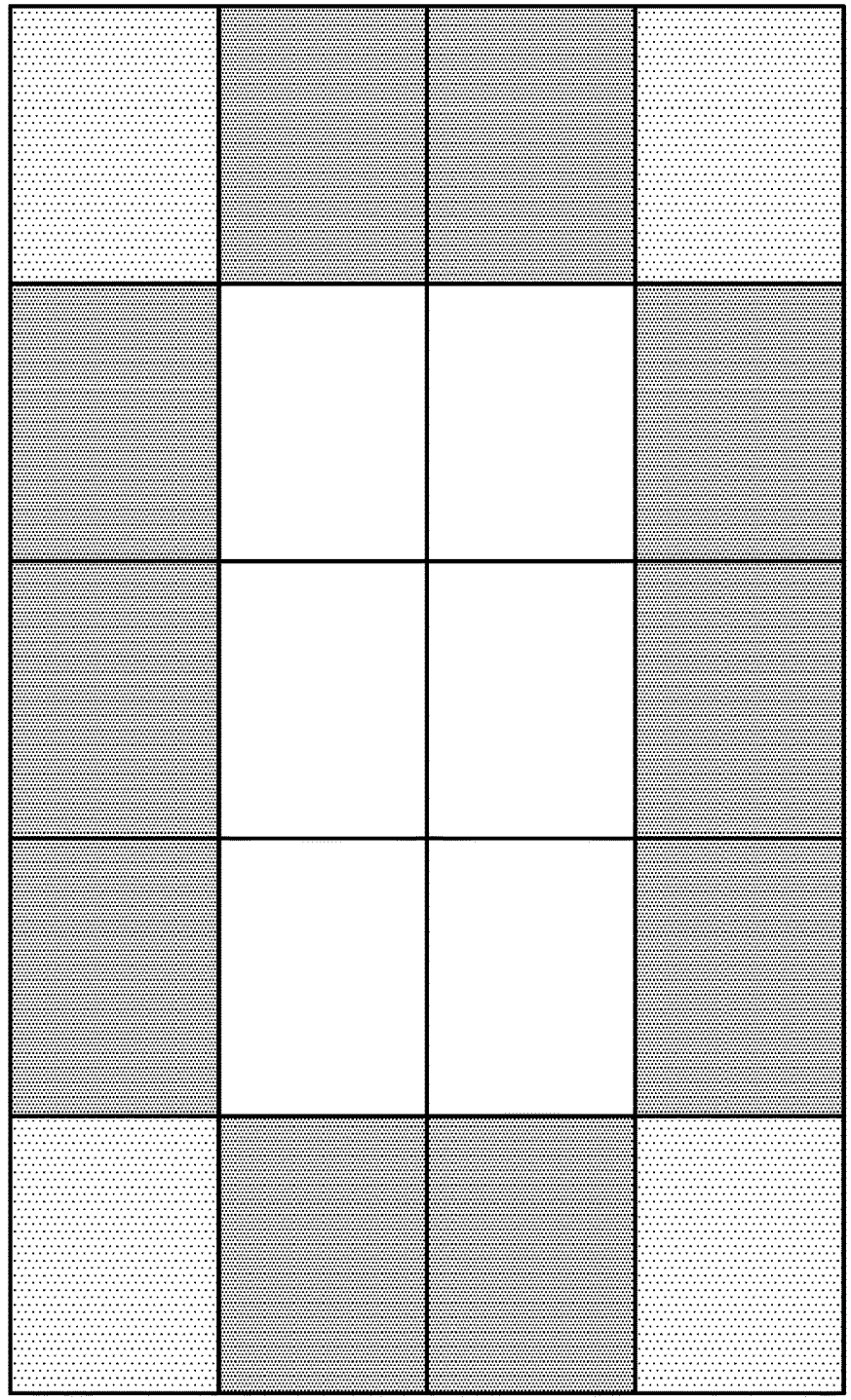
FIG. 5 is a diagram conceptually illustrated an SRAM array.

FIG. 4 are diagrams 400, 410, 420, 430, 440, 450, 460, 470 conceptually illustrating additional SRAM architectures. FIG. 5 is a diagram 500 conceptually illustrating an SRAM array. The SRAM block 340 excludes all core horizontal edge portions 322, the core vertical edge portions 324, and the boundary portion 326 as illustrated in FIG. 3. Alternatively, an SRAM block may include a core horizontal edge portion 322 and/or a core vertical edge portion 324 and a corresponding boundary portion 326 on one or two edges of the SRAM block. For example, the SRAM block 400 has a core vertical edge portion 324 and a corresponding boundary portion 326 on a left edge, the SRAM block 410 has a core horizontal edge portion 322 and a corresponding boundary portion 326 on a top edge, the SRAM block 420 has a core vertical edge portion 324 and a corresponding boundary portion 326 on a right edge, and the SRAM block 430 has a core horizontal edge portion 322 and a corresponding boundary portion 326 on a bottom edge. When located within an SRAM array, the SRAM blocks 400, 410, 420, 430 could be located at central edge portions 502 of the SRAM array. For another example, the SRAM block 440 has a core horizontal edge portion 322, a core vertical edge portion 324, and a corresponding boundary portion 326 on the top and left edges; the SRAM block 450 has a core horizontal edge portion 322, a core vertical edge portion 324, and a corresponding boundary portion 326 on the top and right edges; the SRAM block 460 has a core horizontal edge portion 322, a core vertical edge portion 324, and a corresponding boundary portion 326 on the bottom and right edges; and the SRAM block 470 has a core horizontal edge portion 322, a core vertical edge portion 324, and a corresponding boundary portion 326 on the bottom and left edges. When located within an SRAM array, the SRAM blocks 440, 450, 460, 470 could be located at corner portions 504 of the SRAM array.

Figure 6:
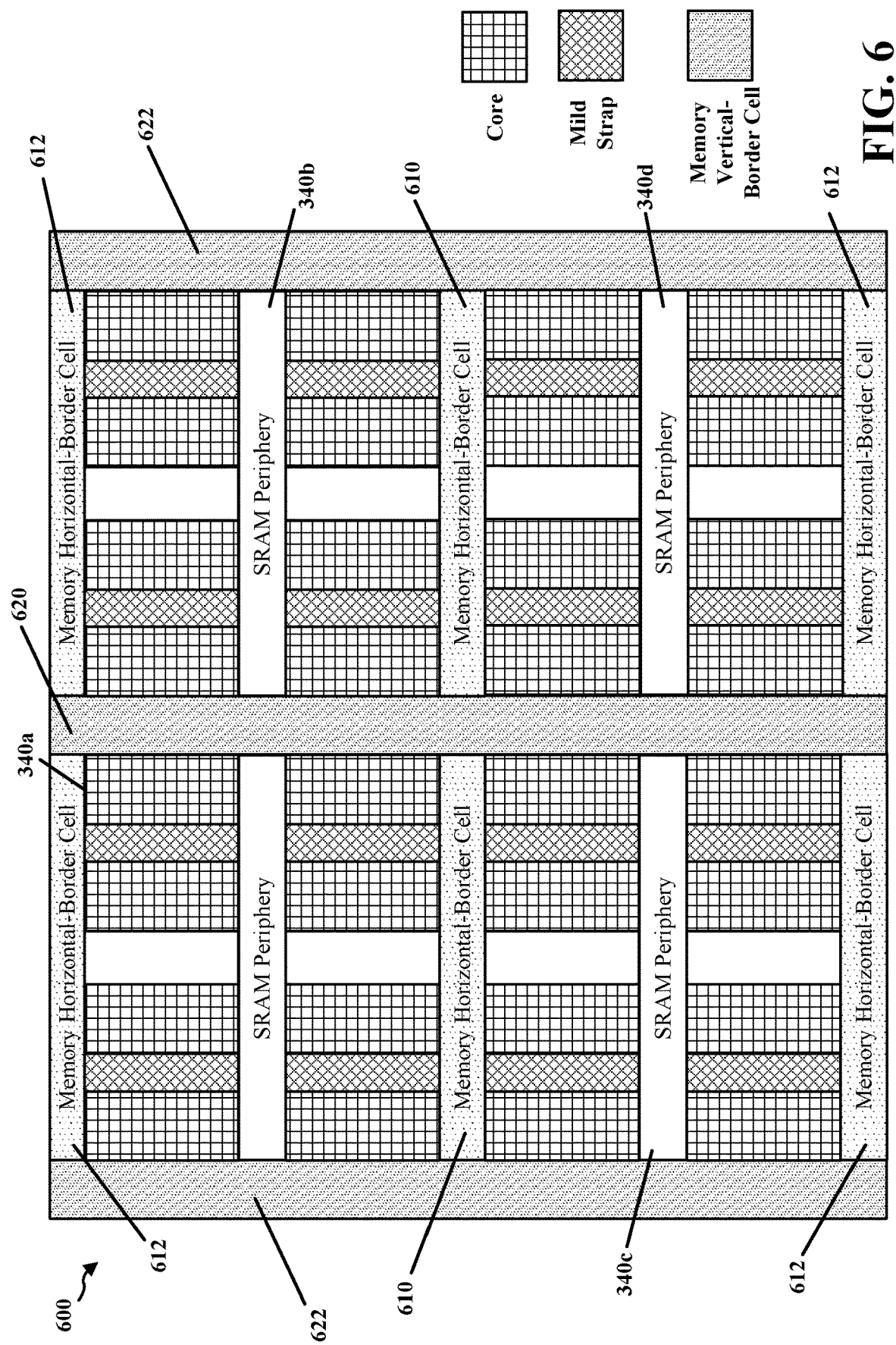
FIG. 6 is a diagram conceptually illustrating an SRAM architecture, including memory horizontal-border cells and memory vertical-border cells.

FIG. 6 is a diagram 600 conceptually illustrating an SRAM architecture, including memory horizontal-border cells 610, 612 and memory vertical-border cells 620, 622. As illustrated in FIG. 6, SRAM blocks 340a, 340b, 340c, 340d are located in a 2×2 array. The SRAM blocks 340a, 340b, 340c, 340d exclude core edge and boundary portions. Between SRAM blocks 340a and 340c, a memory horizontal-border cell 610 may be located. The memory horizontal-border cell 610 includes double sided (dual) memory core endcaps, providing memory core endcaps for both the SRAM blocks 340a, 340c. Between SRAM blocks 340b and 340d, a memory horizontal-border cell 610 may be located. The memory horizontal-border cell 610 includes double sided memory core endcaps, providing memory core endcaps for both the SRAM blocks 340b, 340d. Between the sets of SRAM blocks 340a, 340c and 340b, 340d, a memory vertical-border cell 620 may be located. The memory vertical-border cell 620 includes double sided (dual) memory core endcaps, providing memory core endcaps for the sets of SRAM blocks 340a, 340c and 340b, 340d. On top edges of the SRAM blocks 340a, 340b, and on bottom edges of the SRAM blocks 340c, 340d, memory horizontal-border cells 612 may be located. The memory horizontal-border cells 612 may each include a single memory core endcap, providing the memory core endcap for the SRAM blocks 340a, 340b, 340c, 340d. On a left edge of the set of SRAM blocks 340a, 340c, and on a right edge of the SRAM blocks 340b, 340d, memory vertical-border cells 622 may be located. The memory vertical-border cells 622 each include a single memory core endcap, providing a memory core endcap for the set of SRAM blocks 340a, 340c and a memory core endcap for the set of SRAM blocks 340b, 340d.

The memory horizontal-border cell 610 may contain broken/discontinuous word lines (WLs) within the memory core endcaps. The memory horizontal-border cell 610 may further include power/ground (PG) tracks and well taps. The WLs and PG tracks have proper separation for providing the requisite WL and PG track isolation to satisfy DRC rules. In addition, the memory vertical-border cell 620 may contain broken/discontinuous bit lines (BLs) within the memory core endcaps. The memory vertical-border cell 620 may further include PG tracks and well taps. The BLs and PG tracks have proper separation for providing the requisite BL and PG track isolation to satisfy DRC rules. A memory core endcap may be defined as a memory layout structure within the memory horizontal-border/vertical-border cells 610, 620 that provides a termination for a memory.

Each of the memory border cells 610, 612, 620, 622 include one or two memory core endcaps with a boundary portion. The boundary portion may be referred to as a memory gap portion. Specifically, the memory horizontal-border cell 610 includes double sided (dual) memory core endcaps, with a memory gap portion between the two memory core endcaps. Similarly, the memory vertical-border cell 620 includes double sided (dual) memory core endcaps, with a memory gap portion between the two memory core endcaps. The memory horizontal-border cells 612 and the memory vertical-border cells 622 include a single memory core endcap with a memory gap (boundary) portion. The memory gap portions in the memory border cells 610, 612, 620, 622 satisfy the aforementioned DRC rules. Example memory border cells are provided infra with respect to FIGS. 7-10.

Figure 7:
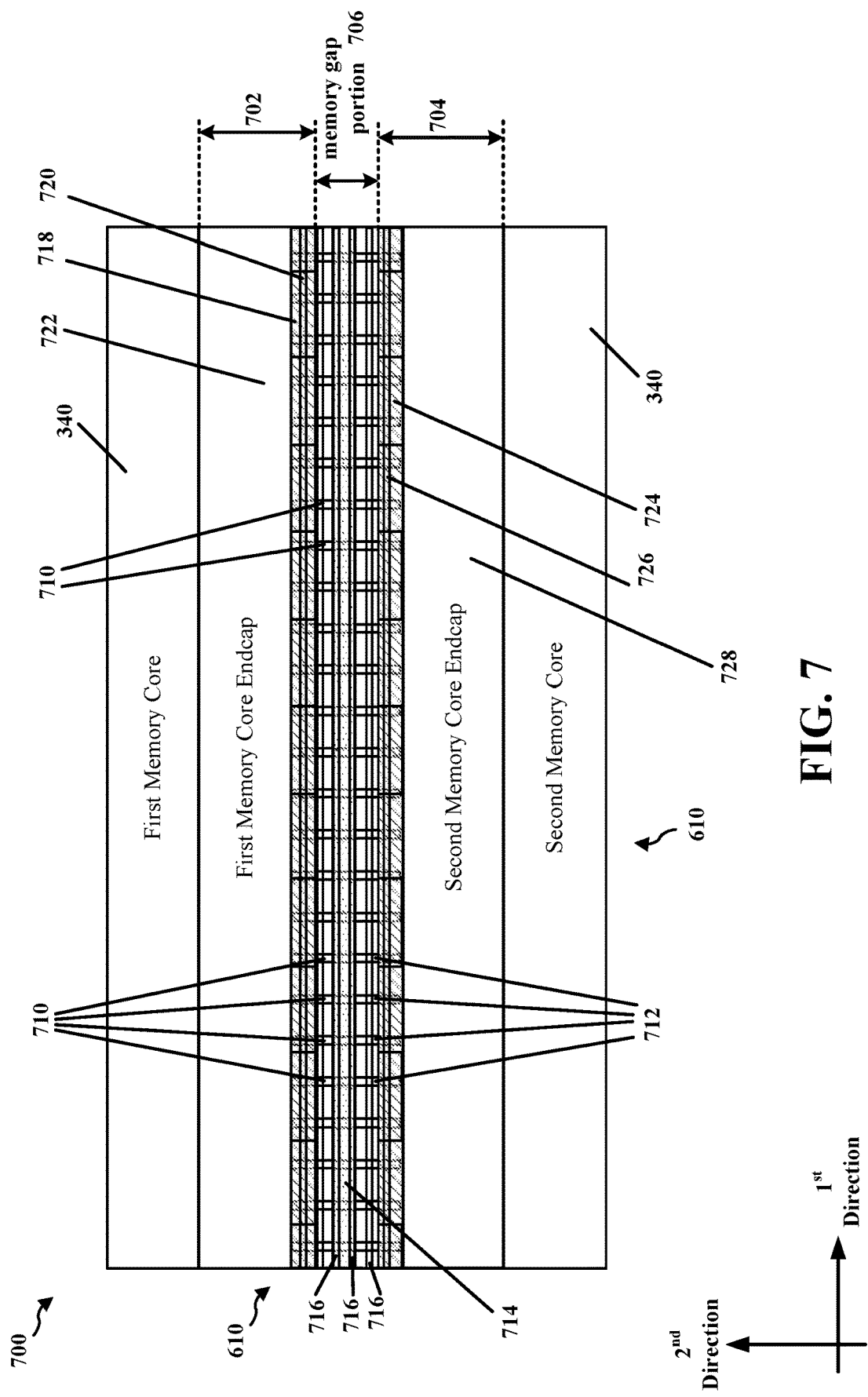
FIG. 7 is a diagram conceptually illustrating a memory horizontal-border cell with a double memory core endcap.

FIG. 7 is a diagram 700 conceptually illustrating a memory horizontal-border cell 610 with double sided memory core endcaps 702, 704. The memory horizontal-border cell 610 includes a first memory core endcap 702 (a portion of which is non-illustrated) extending horizontally in a first direction on a first side of the cell, and includes a second memory core endcap 704 (a portion of which is non-illustrated) extending horizontally in the first direction on a second side of the cell. The second side is opposite the first side in a second direction, where the second direction is orthogonal to the first direction. Each of the memory core endcaps 702, 704 include well taps and include WLs that terminate within the memory core endcaps 702, 704. Between the first memory core endcap 702 and the second memory core endcap 704, a memory gap portion 706 extends horizontally in the first direction. The memory gap portion 706 provides a gap in the second direction between the first memory core endcap and the second memory core endcap. The gap is large enough to satisfy DRC rules in association with WL spacing and PG spacing between the different sets of WLs and PG lines in the memory core endcaps 702, 704. The memory gap portion 706 includes a first set of gate interconnects 710 (only a subset of the gate interconnects are referenced) extending in the second direction from the first memory core endcap 702. The memory gap portion 706 further includes a second set of gate interconnects 712 (only a subset of the gate interconnects are referenced) extending in the second direction from the second memory core endcap 704. The first set of gate interconnects 710 and the second set of gate interconnects 712 are formed from one set of gate interconnects that is cut by a gate interconnect cut 714 (which may be referred to as a POLY cut). Accordingly, respective gate interconnects of the first and second sets of gate interconnects 710, 712 are collinear and separated in a center portion (corresponding to the gate interconnect cut 714) of the memory gap portion 706. The memory gap portion 706 further includes fins 716 extending in the first direction in the center portion of the memory gap portion 706. The fins 716 may be undoped. The first memory core endcap 702 includes a first diffusion region 718, where the first diffusion region 718 is formed by a plurality of doped (n-type or p-type) fins 720 (additional fins 720 are located in the non-illustrated portion 722). The second memory core endcap 704 includes a second diffusion region 724, where the second diffusion region 724 is formed by a plurality of doped (n-type or p-type) fins 726 (additional fins 726 are located in the non-illustrated portion 728). Accordingly, the fins 716 of the memory gap portion 706, the first diffusion region 718, and the second diffusion region 724 are discontinuous with each other (i.e., not formed by one continuous diffusion region).

The memory horizontal-border cell 610 with dual memory core endcaps 702, 704 and the memory gap portion 706 may provide as much as a 64% area savings as compared to two adjacent core horizontal edge portions 322 and boundary portions 326 of the SRAM blocks 320.

Figure 8:
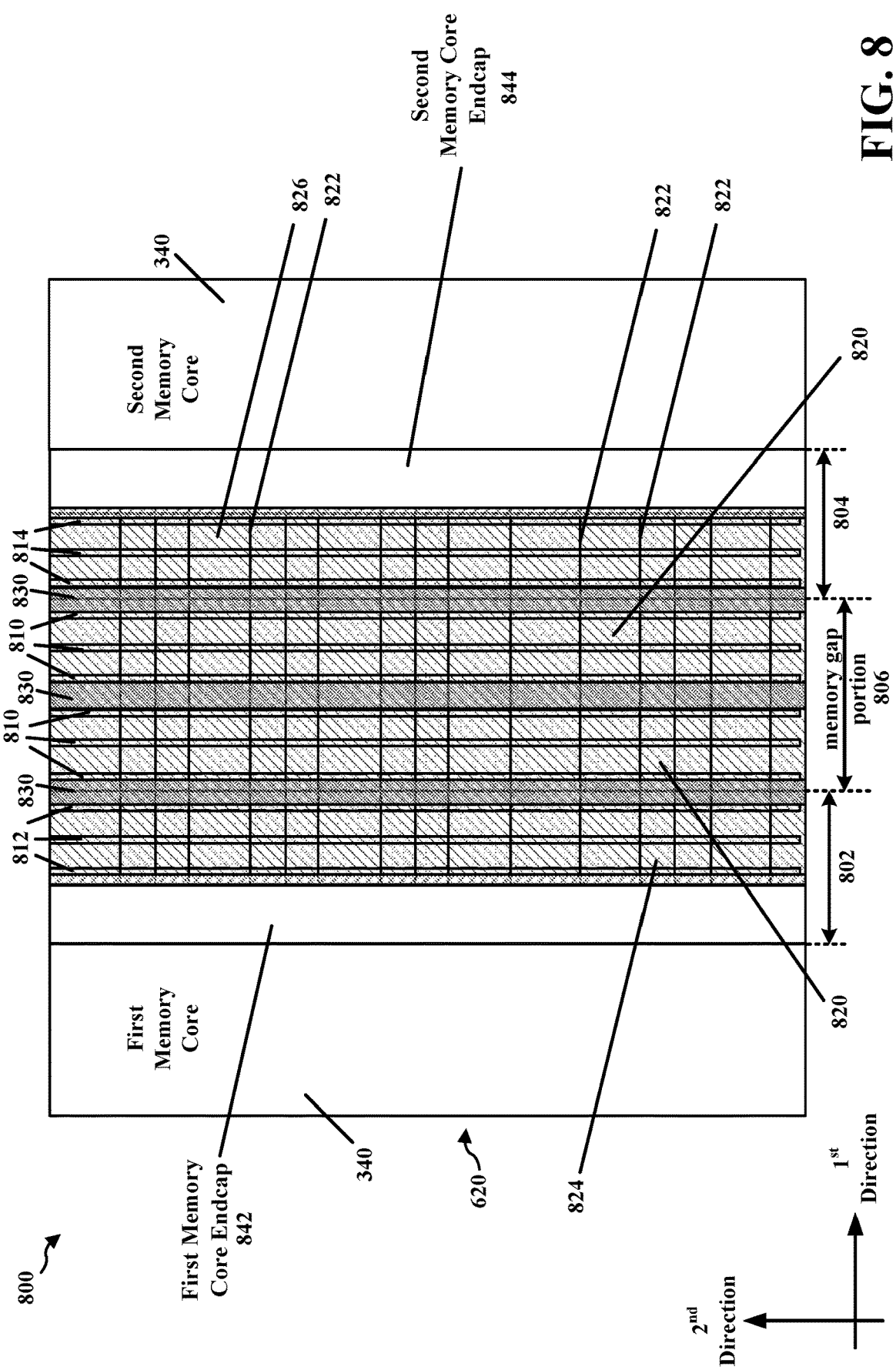
FIG. 8 is a first diagram conceptually illustrating a memory vertical-border cell with a double memory core endcap.

FIG. 8 is a first diagram 800 conceptually illustrating a memory vertical-border cell 620 with double sided memory core endcaps. The memory vertical-border cell 620 includes a first memory core endcap 802 (a portion of which is non-illustrated) extending vertically in a second direction on a first side of the cell 620, and a second memory core endcap 804 (a portion of which is non-illustrated) extending vertically in the second direction on a second side of the cell 620. The second side is opposite the first side in the first direction, where the first direction is orthogonal to the second direction. Each of the memory core endcaps 802, 804 include well taps and include BLs that terminate within the memory core endcaps 802, 804. Between the first memory core endcap 802 and the second memory core endcap 804, a memory gap portion 806 extending vertically in the second direction. The memory gap portion 806 provides a gap in the first direction between the first memory core endcap 802 and the second memory core endcap 804. The gap is large enough to satisfy DRC rules in association with BL spacing and PG spacing between the different sets of BLs and PG lines in the memory core endcaps 802, 804. The memory gap portion 806 includes gate interconnects 810 extending in the second direction. The memory gap portion 806 includes diffusion regions 820 extending in the first direction. The diffusion regions 820 are in a center portion of the memory gap portion. The diffusion regions 820 include fins (only a subset of the fins is labeled) extending in the first direction. The first memory core endcap 802 includes gate interconnects 812 extending in the second direction and a first diffusion region 824 (additional gate interconnects 812 are located in the non-illustrated portion 842). The second memory core endcap 804 includes gate interconnects 814 extending in the second direction and a second diffusion region 826 (additional gate interconnects 814 are located in the non-illustrated portion 844). The diffusion regions 820, 824, 826 are discontinuous with each other, as a plurality of fin cuts 830 cut the fins 822.

The memory vertical-border cell 620 with dual memory core endcaps 802, 804 and the memory gap portion 806 may provide as much as a 49% area savings as compared to two adjacent core vertical edge portions 324 and boundary portions 326 of the SRAM blocks 320.

Figure 9:
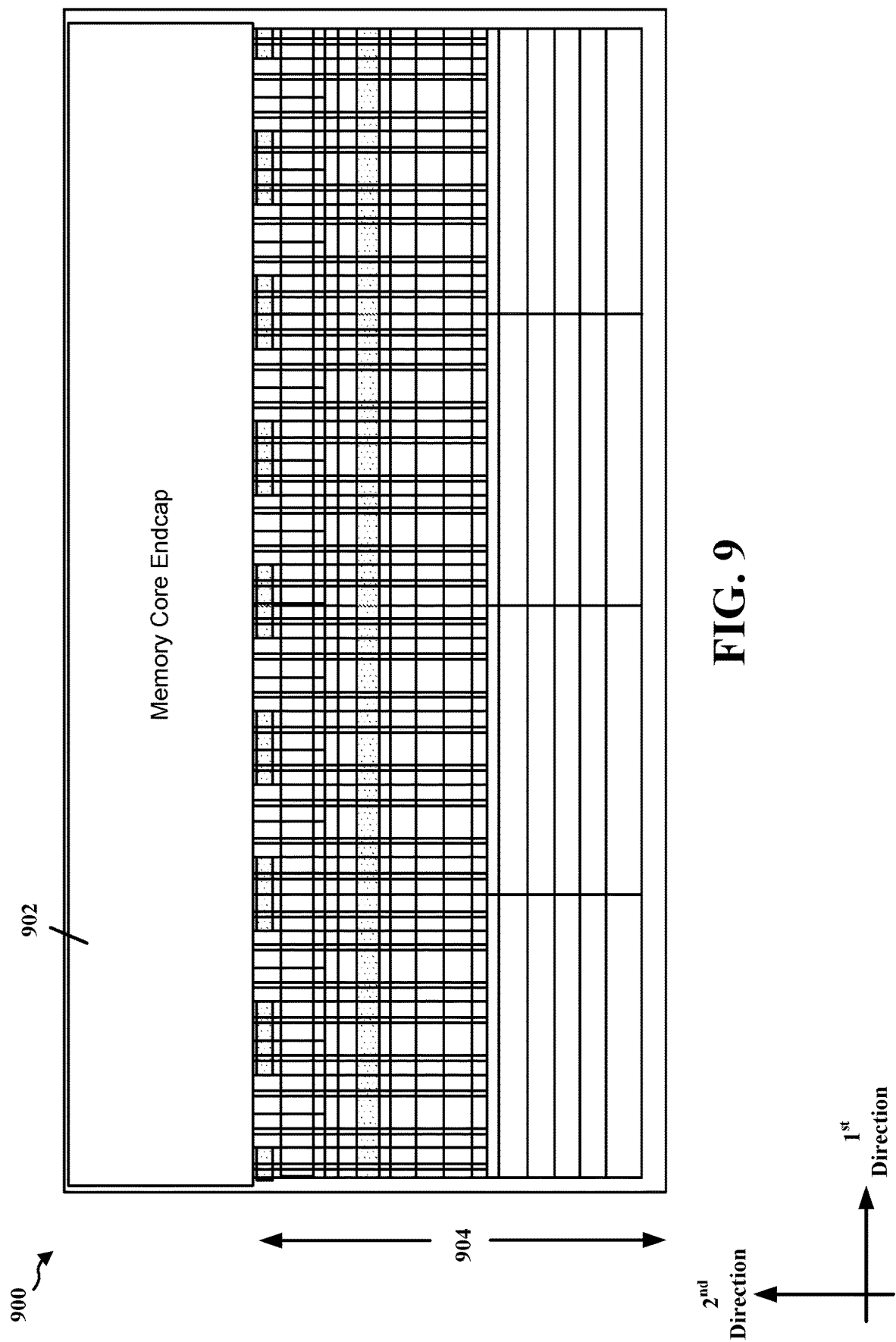
FIG. 9 is a diagram conceptually illustrating a memory horizontal-border cell with a single memory core endcap.
Figure 10:
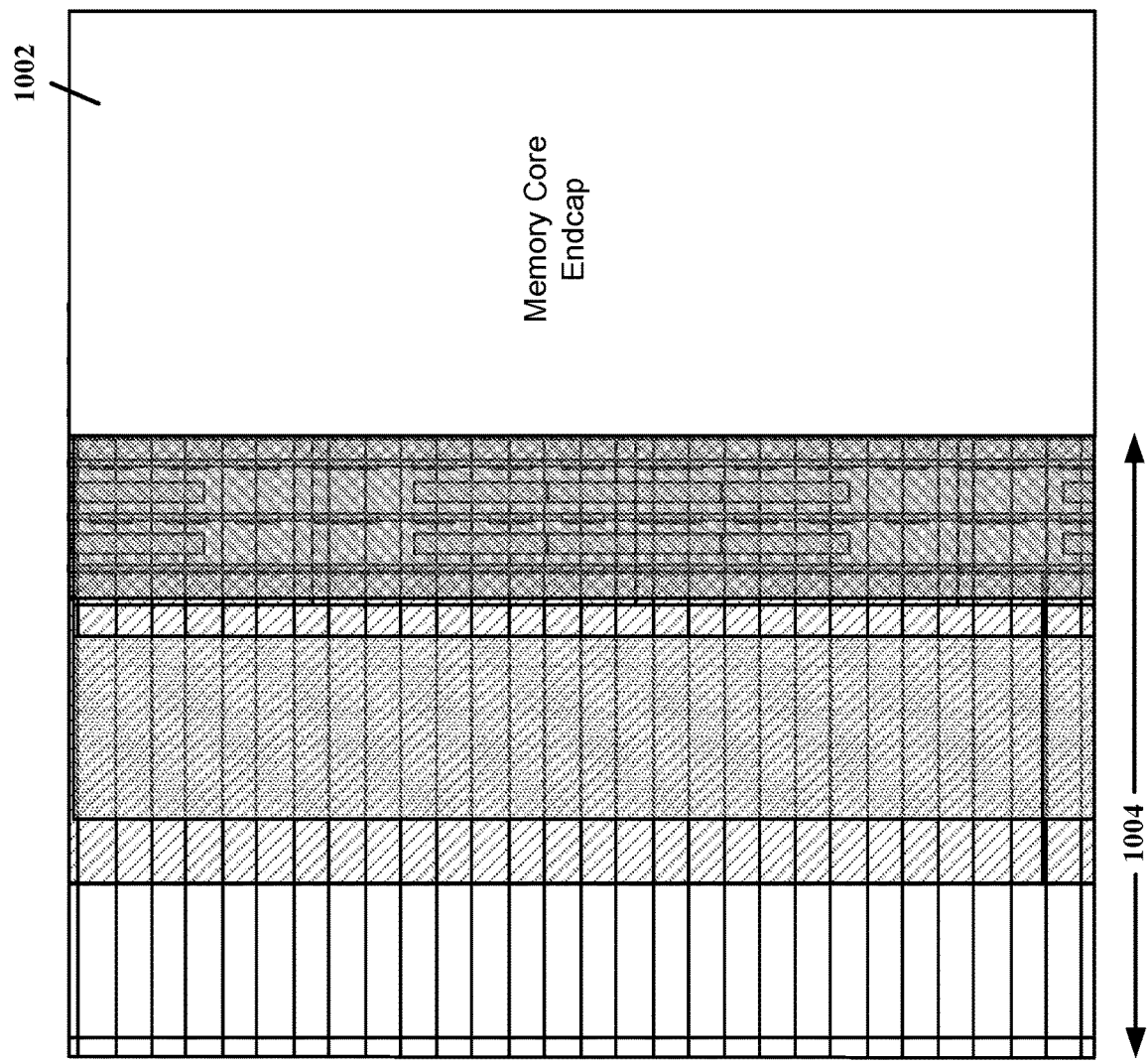
FIG. 10 is a diagram conceptually illustrating a memory vertical-border cell with a single memory core endcap.
Figure 10:

FIG. 9 is a diagram 900 illustrating a memory horizontal-border cell 612 with a single memory core endcap 902. FIG. 10 is a diagram 1000 conceptually illustrating a memory vertical-border cell 622 with a single memory core endcap 1002. The memory horizontal-border cell 612 includes one memory core endcap 902 and a memory gap (boundary) portion 904 adjacent the memory core endcap 902. The memory vertical-border cell 622 includes one memory core endcap 1002 and a memory gap (boundary) portion 1004 adjacent the memory core endcap 1002. The memory border cells 612, 622 may be used to terminate just one SRAM block 340.

Referring again to FIGS. 3-9, in a first aspect of the disclosure, a memory horizontal-border cell 610 on an IC includes a first memory core endcap 702 extending horizontally in a first direction on a first side of the cell, and a second memory core endcap 704 extending horizontally in the first direction on a second side of the cell. The second side is opposite the first side in a second direction. The second direction is orthogonal to the first direction. The memory horizontal-border cell 610 further includes a memory gap portion 706 extending horizontally in the first direction between the first memory core endcap 702 and the second memory core endcap 704. The memory gap portion 706 provides a gap in the second direction between the first memory core endcap 702 and the second memory core endcap 704.

In one configuration, the memory gap portion 706 includes a first plurality of gate interconnects 710 extending in the second direction from the first memory core endcap 702, and a second plurality of gate interconnects 712 extending in the second direction from the second memory core endcap 704. Respective gate interconnects of the first and second plurality of gate interconnects 710, 712 are collinear and separated in a center portion of the memory gap portion 706. In one configuration, the memory gap portion 706 includes a plurality of fins 716 extending in the first direction. The plurality of fins 716 is in a center portion of the memory gap portion 706. In one configuration, the first memory core endcap 702 includes a first diffusion region 718 and the second memory core endcap includes a second diffusion region 724. The plurality of fins 716 of the memory gap portion 706, the first diffusion region 718, and the second diffusion region 724 are discontinuous with each other.

In a second aspect of the disclosure, a memory vertical-border cell 620 on an IC includes a first memory core endcap 802 extending vertically in a second direction on a first side of the cell, and a second memory core endcap 804 extending vertically in the second direction on a second side of the cell. The second side is opposite the first side in a first direction. The first direction is orthogonal to the second direction. The memory vertical-border cell 620 further includes a memory gap portion 806 extending vertically in the second direction between the first memory core endcap 802 and the second memory core endcap 804. The memory gap portion 806 provides a gap in the first direction between the first memory core endcap 802 and the second memory core endcap 804.

In one configuration, the memory gap portion 806 includes a plurality of gate interconnects 810 extending in the second direction. In one configuration, the memory gap portion 806 includes at least one diffusion region 820 extending in the first direction. The diffusion region(s) 820 are in a center portion of the memory gap portion 806. In one configuration, the diffusion region(s) 820 include a plurality of fins 822 extending in the first direction. In one configuration, the first memory core endcap 802 includes a first diffusion region 824, and the second memory core endcap 804 includes a second diffusion region 826. The diffusion region(s) 820 of the memory gap portion 806, the first diffusion region 824, and the second diffusion region 826 are discontinuous with each other, as a result of the fin cuts 830 at the interface of the first memory core endcap 802 and memory gap portion 806 and at the interface of the second memory core endcap 804 and memory gap portion 806. There may be an additional fin cut 830 at a center of the memory gap portion 806.

In a third aspect of the disclosure, an IC includes a first memory block 340 (or memory blocks 400, 410, 420, 430, 440, 450, 460, 470), a second memory block 340 (or memory blocks 400, 410, 420, 430, 440, 450, 460, 470), and a first memory border cell 610, 620 between the first memory block 340 and the second memory block 340. The first memory border cell 610, 620 includes a first memory core endcap 702, 802 to the first memory block 340 on a first side of the cell, and a second memory core endcap 704, 804 to the second memory block 340 on a second side of the cell. The second side is opposite the first side. The first memory border cell 610, 620 further includes a memory gap portion 706, 806 between the first memory core endcap 702, 802 and the second memory core endcap 704, 804. The memory gap portion 706, 806 provides a gap between the first memory core endcap 702, 802 and the second memory core endcap 704, 804. In one configuration, the first memory block and the second memory block may each be an SRAM.

In one configuration, the first memory border cell is a horizontal-border cell 610, the first memory core endcap 702 extends horizontally in a first direction on the first side of the cell, and the second memory core endcap 704 extends horizontally in the first direction on the second side of the cell. The second side is opposite the first side in a second direction. The second direction is orthogonal to the first direction. The memory gap portion 706 extends horizontally in the first direction between the first memory core endcap 702 and the second memory core endcap 704. In one configuration, the memory gap portion 706 includes a first plurality of gate interconnects 710 extending in the second direction from the first memory core endcap 702, and a second plurality of gate interconnects 712 extending in the second direction from the second memory core endcap 704. Respective gate interconnects of the first and second plurality of gate interconnects 710, 712 are collinear and separated in a center portion of the memory gap portion 706. In one configuration, wherein the memory gap portion 706 includes a plurality of fins 716 extending in the first direction. The plurality of fins 716 is in a center portion of the memory gap portion 706. In one configuration, the first memory core endcap 702 includes a first diffusion region 718, and the second memory core endcap 704 includes a second diffusion region 724. The diffusion regions 718, 724 are formed by different diffusion regions, both of which are separate from the region including the fins 716, which may be undoped. Consequently, the plurality of fins 716 of the memory gap portion 706, the first diffusion region 718, and the second diffusion region 724 are discontinuous with each other.

In one configuration, the first memory border cell is a vertical-border cell 620, the first memory core endcap 802 extends vertically in a second direction on the first side of the cell, and the second memory core endcap 804 extends vertically in the second direction on the second side of the cell. The second side is opposite the first side in a first direction. The first side is orthogonal to the second direction. The memory gap portion 806 extends vertically in the second direction between the first memory core endcap 802 and the second memory core endcap 804. In one configuration, the memory gap portion 806 includes a plurality of gate interconnects 810 extending in the second direction. In one configuration, the memory gap portion 806 includes at least one diffusion region 820 extending in the first direction. The diffusion region(s) 820 are in a center portion of the memory gap portion 806. In one configuration, the diffusion region(s) 820 include a plurality of fins 822 extending in the first direction. In one configuration, the first memory core endcap 802 includes a first diffusion region 824, and the second memory core endcap 804 includes a second diffusion region 826. The diffusion region(s) 820 of the memory gap portion 806, the first diffusion region 824, and the second diffusion region 826 are discontinuous with each other, as a result of the fin cuts 830 at the interface of the first memory core endcap 802 and memory gap portion 806 and at the interface of the second memory core endcap 804 and memory gap portion 806. There may be an additional fin cut 830 at a center of the memory gap portion 806.

In one configuration, the first memory block 340 has a first side and a second side opposite the first side. The first memory border cell 610, 620 is adjacent the second side of the first memory block 340. The IC further includes a second memory border cell 612, 622 adjacent the first memory block 340 at the first side of the first memory block 340. The second memory border cell 612, 622 includes one memory core endcap 902, 1002 to the first memory block 340 on a first side of the cell adjacent the first side of the first memory block 340, and a memory gap portion 904, 1004 on a second side of the cell.

In one configuration, the first memory block 400, 410, 420, 430, 440, 450, 460, 470 has a first side and a second side opposite the first side. The first memory border cell 610, 620 is adjacent the second side of the first memory block. The first memory block 400, 410, 420, 430, 440, 450, 460, 470 includes one memory core endcap 322, 324 and a memory gap portion (boundary portion) 326 on the first side of first memory block 400, 410, 420, 430, 440, 450, 460, 470. Such memory block 400, 410, 420, 430, 440, 450, 460, 470 may be used at an outer perimeter 502, 504 of an SRAM array as illustrated in FIG. 5.

Referring again to FIGS. 6-8, memory horizontal-border cells 610 and memory vertical-border cells 620 are configured with dual memory core endcaps. The cells 610, 620 may be located adjacent base SRAM blocks 340 in an SRAM array, where the SRAM blocks 340 exclude memory core endcaps and boundary portions. The memory horizontal-border cell 610 with dual memory core endcaps 702, 704 and the memory gap portion 706 may provide as much as a 64% area savings as compared to two adjacent core horizontal edge portions 322 and boundary portions 326 of the SRAM blocks 320. In addition, the memory vertical-border cell 620 with dual memory core endcaps 802, 804 and the memory gap portion 806 may provide as much as a 49% area savings as compared to two adjacent core vertical edge portions 324 and boundary portions 326 of the SRAM blocks 320. Together, the separate base SRAM blocks, abutted with the memory horizontal-border cells 610 and the memory vertical-border cells 620 may provide an area savings of around 2%, if not more, and therefore may reduce the SRAM footprint in an SoC device.

The concepts outlined supra may be applied generally to hard macro blocks, as hard macro blocks that are typically placed in an array may be redesigned such that they may be placed adjacent to and interfaced with horizontal-border cells and vertical-border cells that result in a footprint savings in the hard macro block array. Accordingly, the novel placement and interface technique may be applied generally to hard macro blocks. In one configuration, the novel placement and interface technique may be applied to memories, and in a specific configuration, may be applied to SRAMs.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. Two interconnects may be said to be "collinear" if they lie along the same straight line. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

The following examples are illustrative only and may be combined with aspects of other embodiments or teachings described herein, without limitation.

Example 1 is a memory horizontal-border cell on an IC including a first memory core endcap extending horizontally in a first direction on a first side of the cell, and a second memory core endcap extending horizontally in the first direction on a second side of the cell. The second side is opposite the first side in a second direction. The second direction is orthogonal to the first direction. The memory horizontal-border cell further includes a memory gap portion extending horizontally in the first direction between the first memory core endcap and the second memory core endcap. The memory gap portion provides a gap in the second direction between the first memory core endcap and the second memory core endcap.

Example 2 is the memory horizontal-border cell of example 1, wherein the memory gap portion includes a first plurality of gate interconnects extending in the second direction from the first memory core endcap, and a second plurality of gate interconnects extending in the second direction from the second memory core endcap. Respective gate interconnects of the first and second plurality of gate interconnects are collinear and separated in a center portion of the memory gap portion.

Example 3 is the memory horizontal-border cell of any of examples 1 and 2, wherein the memory gap portion includes a plurality of fins extending in the first direction. The plurality of fins is in a center portion of the memory gap portion.

Example 4 is the memory horizontal-border cell of example 3, wherein the first memory core endcap includes a first diffusion region and the second memory core endcap includes a second diffusion region. The plurality of fins of the memory gap portion, the first diffusion region, and the second diffusion region are discontinuous with each other.

Example 5 is a memory vertical-border cell on an IC including a first memory core endcap extending vertically in a second direction on a first side of the cell, and a second memory core endcap extending vertically in the second direction on a second side of the cell. The second side is opposite the first side in a first direction. The first direction is orthogonal to the second direction. The memory vertical-border cell further includes a memory gap portion extending vertically in the second direction between the first memory core endcap and the second memory core endcap. The memory gap portion provides a gap in the first direction between the first memory core endcap and the second memory core endcap.

Example 6 is the memory vertical-border cell of example 5, wherein the memory gap portion includes a plurality of gate interconnects extending in the second direction.

Example 7 is the memory vertical-border cell of any of examples 5 and 6, wherein the memory gap portion includes a diffusion region extending in the first direction. The diffusion region is in a center portion of the memory gap portion.

Example 8 is the memory vertical-border cell of example 7, wherein the diffusion region includes a plurality of fins extending in the first direction.

Example 9 is the memory vertical-border cell of any of examples 7 and 8, wherein the first memory core endcap includes a first diffusion region, and the second memory core endcap includes a second diffusion region. The diffusion region of the memory gap portion, the first diffusion region, and the second diffusion region are discontinuous with each other.

Example 10 is an IC including a first memory block, a second memory block, and a first memory border cell between the first memory block and the second memory block. The first memory border cell includes a first memory core endcap to the first memory block on a first side of the cell, and a second memory core endcap to the second memory block on a second side of the cell. The second side is opposite the first side. The first memory border cell further includes a memory gap portion between the first memory core endcap and the second memory core endcap. The memory gap portion provides a gap between the first memory core endcap and the second memory core endcap.

Example 11 is the IC of example 10, wherein the first memory border cell is a horizontal-border cell, the first memory core endcap extends horizontally in a first direction on the first side of the cell, the second memory core endcap extends horizontally in the first direction on the second side of the cell, the second side is opposite the first side in a second direction, the second direction is orthogonal to the first direction, and the memory gap portion extends horizontally in the first direction between the first memory core endcap and the second memory core endcap.

Example 12 is the IC of example 11, wherein the memory gap portion includes a first plurality of gate interconnects extending in the second direction from the first memory core endcap, and a second plurality of gate interconnects extending in the second direction from the second memory core endcap. Respective gate interconnects of the first and second plurality of gate interconnects are collinear and separated in a center portion of the memory gap portion.

Example 13 is the IC of any of examples 11 and 12, wherein the memory gap portion includes a plurality of fins extending in the first direction. The plurality of fins is in a center portion of the memory gap portion.

Example 14 is the IC of example 13, wherein the first memory core endcap includes a first diffusion region, and the second memory core endcap includes a second diffusion region. The plurality of fins of the memory gap portion, the first diffusion region, and the second diffusion region are discontinuous with each other.

Example 15 is the IC of any of examples 10 to 14, wherein the first memory border cell is a vertical-border cell, the first memory core endcap extends vertically in a second direction on the first side of the cell, the second memory core endcap extends vertically in the second direction on the second side of the cell, the second side is opposite the first side in a first direction, the first side is orthogonal to the second direction, and the memory gap portion extends vertically in the second direction between the first memory core endcap and the second memory core endcap.

Example 16 is the IC of example 15, wherein the memory gap portion includes a plurality of gate interconnects extending in the second direction.

Example 17 is the IC of any of examples 15 and 16, wherein the memory gap portion includes a diffusion region extending in the first direction. The diffusion region is in a center portion of the memory gap portion.

Example 18 is the IC of example 17, wherein the diffusion region includes a plurality of fins extending in the first direction.

Example 19 is the IC of any of examples 17 and 18, wherein the first memory core endcap includes a first diffusion region, and the second memory core endcap includes a second diffusion region. The diffusion region of the memory gap portion, the first diffusion region, and the second diffusion region are discontinuous with each other.

Example 20 is the IC of any of examples 10 to 19, wherein the first memory block has a first side and a second side opposite the first side, the first memory border cell is adjacent the second side of the first memory block, and the IC further includes a second memory border cell adjacent the first memory block at the first side of the first memory block. The second memory border cell includes one memory core endcap to the first memory block on a first side of the cell adjacent the first side of the first memory block, and a memory gap portion on a second side of the cell.

Example 21 is the IC of any of examples 10 to 19, wherein the first memory block has a first side and a second side opposite the first side, the first memory border cell is adjacent the second side of the first memory block, and the first memory block includes one memory core endcap and a memory gap portion on the first side of first memory block.

Example 22 is the IC of any of examples 10 to 21, wherein the first memory block and the second memory block are each an SRAM.

What is claimed is:

1. A memory horizontal-border cell on an integrated circuit (IC), comprising:
   a first memory core endcap extending horizontally in a first direction on a first side of the cell;
   a second memory core endcap extending horizontally in the first direction on a second side of the cell, the second side being opposite the first side in a second direction, the second direction being orthogonal to the first direction; and
   a memory gap portion extending horizontally in the first direction between the first memory core endcap and the second memory core endcap, the memory gap portion providing a gap in the second direction between the first memory core endcap and the second memory core endcap,
   wherein the memory gap portion comprises:
   a first plurality of gate interconnects extending in the second direction from the first memory core endcap; and
   a second plurality of gate interconnects extending in the second direction from the second memory core endcap.

2. The memory horizontal-border cell of claim 1, wherein respective gate interconnects of the first and second plurality of gate interconnects are collinear and separated in a center portion of the memory gap portion.

3. A memory horizontal-border cell on an integrated circuit (IC), comprising:
   a first memory core endcap extending horizontally in a first direction on a first side of the cell;
   a second memory core endcap extending horizontally in the first direction on a second side of the cell, the second side being opposite the first side in a second direction, the second direction being orthogonal to the first direction; and
   a memory gap portion extending horizontally in the first direction between the first memory core endcap and the second memory core endcap, the memory gap portion providing a gap in the second direction between the first memory core endcap and the second memory core endcap, wherein the memory gap portion comprises a plurality of fins extending in the first direction, the plurality of fins being in a center portion of the memory gap portion.

4. The memory horizontal-border cell of claim 3, wherein:
   the first memory core endcap comprises a first diffusion region;
   the second memory core endcap comprises a second diffusion region; and
   the plurality of fins of the memory gap portion, the first diffusion region, and the second diffusion region are discontinuous with each other.

5. A memory vertical-border cell on an integrated circuit (IC), comprising:
   a first memory core endcap extending vertically in a second direction on a first side of the cell;
   a second memory core endcap extending vertically in the second direction on a second side of the cell, the second side being opposite the first side in a first direction, the first direction being orthogonal to the second direction; and
   a memory gap portion extending vertically in the second direction between the first memory core endcap and the second memory core endcap, the memory gap portion providing a gap in the first direction between the first memory core endcap and the second memory core endcap, wherein the memory gap portion comprises a plurality of gate interconnects extending in the second direction.

6. A memory vertical-border cell on an integrated circuit (IC), comprising:
   a first memory core endcap extending vertically in a second direction on a first side of the cell;
   a second memory core endcap extending vertically in the second direction on a second side of the cell, the second side being opposite the first side in a first direction, the first direction being orthogonal to the second direction; and
   a memory gap portion extending vertically in the second direction between the first memory core endcap and the second memory core endcap, the memory gap portion providing a gap in the first direction between the first memory core endcap and the second memory core endcap, wherein the memory gap portion comprises a diffusion region extending in the first direction, the diffusion region being in a center portion of the memory gap portion.

7. The memory vertical-border cell of claim 6, wherein the diffusion region comprises a plurality of fins extending in the first direction.

8. The memory vertical-border cell of claim 6, wherein:
   the first memory core endcap comprises a first diffusion region;
   the second memory core endcap comprises a second diffusion region; and
   the diffusion region of the memory gap portion, the first diffusion region, and the second diffusion region are discontinuous with each other.

9. An integrated circuit (IC), comprising:
   a first memory block;
   a second memory block; and
   a first memory border cell between the first memory block and the second memory block, the first memory border cell comprising:
   a first memory core endcap to the first memory block on a first side of the cell;

a second memory core endcap to the second memory block on a second side of the cell, the second side being opposite the first side; and a memory gap portion between the first memory core endcap and the second memory core endcap, the memory gap portion providing a gap between the first memory core endcap and the second memory core endcap, wherein the memory gap portion comprises at least one of:

(1) a first plurality of gate interconnects extending from the first memory core endcap, and a second plurality of gate interconnects extending from the second memory core endcap;

(2) a plurality of fins in a center portion of the memory gap portion;

(3) a plurality of gate interconnects extending along the memory gap portion; or (4) a diffusion region in the center portion of the memory gap portion.

10. The IC of claim 9, wherein the first memory border cell is a horizontal-border cell, the first memory core endcap extends horizontally in a first direction on the first side of the cell, the second memory core endcap extends horizontally in the first direction on the second side of the cell, the second side is opposite the first side in a second direction, the second direction is orthogonal to the first direction, and the memory gap portion extends horizontally in the first direction between the first memory core endcap and the second memory core endcap.

11. The IC of claim 10, wherein the memory gap portion comprises:

the first plurality of gate interconnects extending in the second direction from the first memory core endcap; and the second plurality of gate interconnects extending in the second direction from the second memory core endcap, respective gate interconnects of the first and second plurality of gate interconnects being collinear and separated in a center portion of the memory gap portion.

12. The IC of claim 10, wherein the memory gap portion comprises the plurality of fins extending in the first direction in the center portion of the memory gap portion.

13. The IC of claim 12, wherein:

the first memory core endcap comprises a first diffusion region;

the second memory core endcap comprises a second diffusion region; and the plurality of fins of the memory gap portion, the first diffusion region, and the second diffusion region are discontinuous with each other.

14. The IC of claim 9, wherein the first memory border cell is a vertical-border cell, the first memory core endcap extends vertically in a second direction on the first side of the cell, the second memory core endcap extends vertically in the second direction on the second side of the cell, the second side is opposite the first side in a first direction, the first side is orthogonal to the second direction, and the memory gap portion extends vertically in the second direction between the first memory core endcap and the second memory core endcap.

15. The IC of claim 14, wherein the memory gap portion comprises the plurality of gate interconnects extending in the second direction.

16. The IC of claim 14, wherein the memory gap portion comprises the diffusion region extending in the first direction in the center portion of the memory gap portion.

17. The IC of claim 16, wherein the diffusion region comprises the plurality of fins extending in the first direction.

18. The IC of claim 16, wherein:

the first memory core endcap comprises a first diffusion region;

the second memory core endcap comprises a second diffusion region; and the diffusion region of the memory gap portion, the first diffusion region, and the second diffusion region are discontinuous with each other.

19. The IC of claim 9, wherein the first memory block has a first side and a second side opposite the first side, the first memory border cell is adjacent the second side of the first memory block, and the IC further comprises:

a second memory border cell adjacent the first memory block at the first side of the first memory block, the second memory border cell comprising one memory core endcap to the first memory block on a first side of the cell adjacent the first side of the first memory block, and a memory gap portion on a second side of the cell.

20. The IC of claim 9, wherein the first memory block has a first side and a second side opposite the first side, the first memory border cell is adjacent the second side of the first memory block, and the first memory block comprises one memory core endcap and a memory gap portion on the first side of first memory block.

21. The IC of claim 9, wherein the first memory block and the second memory block are each a static random access memory (SRAM).

* * * * *